United States Patent
Kawamata et al.

(10) Patent No.: US 6,210,542 B1
(45) Date of Patent: *Apr. 3, 2001

(54) PROCESS FOR PRODUCING THIN FILM, THIN FILM AND OPTICAL INSTRUMENT INCLUDING THE SAME

(75) Inventors: Ken Kawamata; Nobuaki Mitamura, both of Hachioji (JP)

(73) Assignee: Olympus Optical Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/272,731

(22) Filed: Nov. 4, 1998

Related U.S. Application Data

(63) Continuation of application No. 08/683,195, filed on Jul. 18, 1996, now Pat. No. 5,958,155.

(30) Foreign Application Priority Data

Jul. 20, 1995 (JP) .................................... 7-184454

(51) Int. Cl.$^7$ ............................. C23C 14/34; C23C 14/35
(52) U.S. Cl. ................................ 204/192.15; 204/192.26; 204/192.27; 204/192.28
(58) Field of Search ................ 204/192.26, 192.27, 204/192.28, 192.15

(56) References Cited

U.S. PATENT DOCUMENTS

| | | | |
|---|---|---|---|
| 3,649,501 | 3/1972 | Sadagopan | 204/192 |
| 5,178,739 * | 1/1993 | Barnes et al. | 204/192.12 |
| 5,320,984 | 6/1994 | Zhang et al. | 437/233 |
| 5,372,874 | 12/1994 | Dickey et al. | 428/216 |
| 5,513,038 | 4/1996 | Abe | 359/580 |
| 5,958,155 * | 9/1999 | Kawamata et al. | 148/420 |

FOREIGN PATENT DOCUMENTS

| | | | |
|---|---|---|---|
| 3138060 | 12/1978 | (JP) | H01B/5/00 |
| 1032242 | 2/1986 | (JP) | G11B/11/10 |
| 1047645 | 3/1986 | (JP) | H01L/21/31 |
| 1127862 | 6/1986 | (JP) | C23C/14/34 |
| 2177168 | 8/1987 | (JP) | C23C/14/34 |
| 4223401 | 8/1992 | (JP) | G02B/1/10 |

OTHER PUBLICATIONS

Gittleman et al., "Composite Semiconductors: Selective Absorbers of Solar Energy", Solar Energy Materials 1, pp. 93–104, 1979.*

C. W., Pitt et al., "R.F. Sputtered Thin Films For Integrated Optical Components", Thin Solid Films, vol. 26, pp. 25–51 (1975).

(List continued on next page.)

*Primary Examiner*—Nam Nguyen
*Assistant Examiner*—Steven H. Ver Steeg
(74) *Attorney, Agent, or Firm*—Ostrolenk, Faber, Gerb & Soffen, LLP

(57) ABSTRACT

A substrate 2 is autorotatably installed in a vacuum chamber 1 at an upper part thereof. MgF$_2$ granules 3 as a film source material are put in a quartz boat 4 and mounted on a magnetron cathode 5. The magnetron cathode 5 is connected through a matching box 6 to a 13.56 MHz radio frequency power source 7. Cooling water 8 for holding the temperature of the magnetron cathode 5 constant flows on a lower face of the magnetron cathode 5. A side face of the vacuum chamber 1 is provided with gas introduction ports 9, 10 for introducing gas in the vacuum chamber 1. A shutter 11 is placed between the magnetron cathode 5 and the substrate 2. This structure provides a process enabling forming a thin film at a high speed by sputtering, especially, a high speed sputtering process enabling forming a thin fluoride film free of light absorption in a high speed by sputtering.

7 Claims, 10 Drawing Sheets

OTHER PUBLICATIONS

Vacuum, Dec. 1985, UK., vol. 35, No. 12, "Thin films prepared by sputtering MgF/sub 2/ in an RF planar magnetron".

Journal of Applied Physics, Oct. 1993, U.S.A., vol. 74, No. 8, "Radio frequency sputter deposition and properties of calcium fluoride thin films".

Journal of Material Science Letters, Aug. 1994, UK., vol. 13, No. 16, "Temperature dependence of sputtering yield of GaAs unser 30 keV ar/sup+bombardment".

W.J., Coleman, "Evolution of Optical Thin Films by Sputtering", Appl. Opt., vol. 13, (1974) 4, pp. 946–951.

M. Bhunshan, et al., "Sequential Ar–$O_2$ sputtering of $Y_2O_3$, $BaF_2$ and CuO targets for preparation of Y–Ba–Cu–O superconducting films without wet $O_2$ annealing", Appl. Phys. Lett., vol. 55 (1989) 23, pp. 2438–2440.

J.G., Cook, et al., "R.F. magnetron deposition of calcium fluoride", Thin solid films, 217 (1992), pp. 87–90.

H.A., Macleod, "Optical Thin Film Deposition", Int. Conf. Ion Plat. Allied Tech. vol. II (1979), pp. 74–83.

* cited by examiner

PROCESS FOR PRODUCING THIN FILM, THIN FILM AND OPTICAL INSTRUMENT INCLUDING THE SAME

This is a continuation of application Ser. No. 08/683,195, filed Jul. 18, 1996 now U.S. Pat. No. 5,958,155.

BACKGROUND OF THE INVENTION

1. Field of The Invention

The present invention relates to a process for producing a thin film by sputtering at a high speed and a thin film produced thereby, especially, an optical thin film such as an antireflection coating film. More particularly, the present invention is concerned with a process in which a surface of a film source material is heated and the heated surface is sputtered by ions to thereby produce a thin film and a thin film produced thereby. Further, the present invention relates to an optical instrument including such a thin film.

2. Discussion of Related Art

The vacuum evaporation has widely been employed in the formation of a thin film, especially, an optical thin film such as an antireflection coating film, a half mirror or an edge filter because not only is the processing easy but also the deposition for film formation can be conducted at a high rate.

In recent years, the demand for coating by sputtering is increasing in the formation of an optical thin film and other thin films because of its advantages over the vacuum evaporation in automation, energy saving and applicability to substrates with large surface areas.

However, the sputtering process has a drawback in that the film formation is slower than in the vacuum evaporation process. In the formation of a metal coating film, the sputtering process is still practicable. However, in the formation of other coating films, the extreme slowness of film formation has tended to delay the industrial spread of the sputtering process. Moreover, the sputtering process has encountered the problem that, in the sputtering of a fluoride such as $MgF_2$ of low refractive index which provides a typical optical thin film, dissociation occurs into F and species such as Mg so that F is deficient in the coating film to thereby cause the coating film to suffer from absorption of visible radiation.

The above drawback and problem have been a serious obstacle in the application of the sputtering process to optical thin films.

For example, an invention in which the sputtering process has been applied to optical thin films is disclosed in Japanese Patent Application Laid-Open Specification No. 223401/1992.

In the above specification, it is disclosed that, although sputtering of $MgF_2$ per se leads to absorption of visible radiation, sputtering of $MgF_2$ doped with Si as a target enables forming a coating film of low refractive index substantially free of light absorption.

In the invention of Japanese Patent Application Laid-Open Specification No. 223401/1992, however, the highest rate of deposition for film formation is only 10 nm/min or less even when a radio frequency power of 500 W (2.8 $W/cm^2$) is inputted to a 6-inch target. That is, the invention has not overcome the drawback of the sputtering process that the film formation is slow.

When the deposition rate is only 10 nm/min or less, for example, formation of a monolayer antireflection coating film used in the visible region would take 10 min or more.

Thus, it is clear why the industrial spread of the disclosed sputtering process is difficult.

Further, follow-up experiments made by the instant applicant in accordance with this prior art have demonstrated that, when an $MgF_2$ plate having an Si wafer disposed thereon as a target is sputtered, the light absorption in the visible region is on a practically negligible order but a coating film with a refractive index of 1.4 or less cannot be formed.

SUMMARY OF THE INVENTION

Objects of the present invention are to provide a process for producing a thin film, especially, a thin fluoride film free of light absorption by sputtering at a high speed and a thin film produced thereby, especially, an optical thin film such as an antireflection coating film.

The foregoing and other objects, features and advantages of the present invention will become apparent from the following detailed description and appended claims taken in connection with the accompanying drawings.

DETAILED DESCRIPTION OF THE INVENTION

Figure 1:
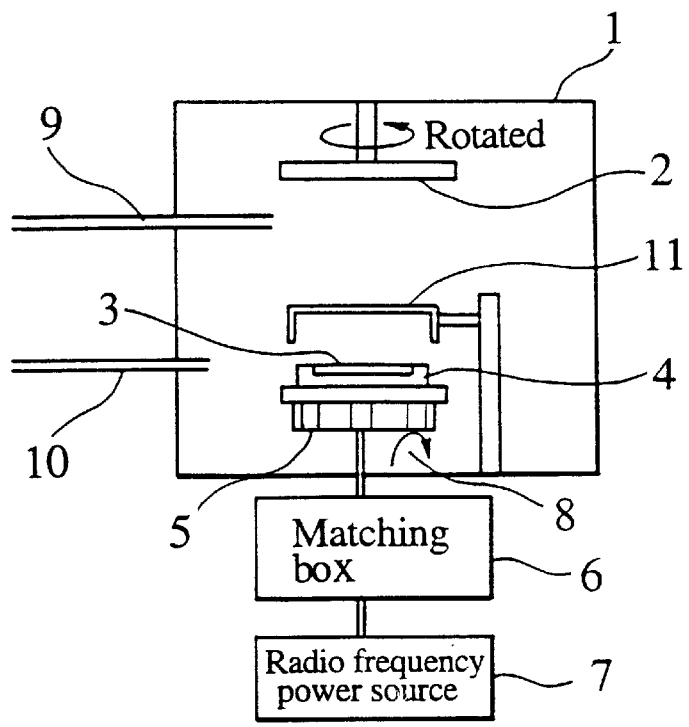
FIG. 1 is a schematic diagram of the structure of the apparatus employed in Embodiment 1 of the present invention.

In the first aspect of the present invention, there is provided a process for producing a thin film which comprises heating a surface of a film source material, causing ions to sputter the surface of the film source material so that at least a part of the film source material is ejected in molecular form and depositing the film source material in molecular form on a substrate to thereby form a thin film on the substrate.

In the second aspect of the present invention, there is provided a process as recited above, wherein the film source material is sputtered by positive ions while not only applying an alternating voltage to an electrode having the film source material disposed thereon to thereby cause the electrode to have a negative potential but also applying alternating current power so as to generate plasma over the film source material to thereby cause the surface of the film source material to have its temperature raised by the plasma.

In the third aspect of the present invention, there is provided a process as recited above, wherein the film source material is in the form of granules having an average grain size of 0.1 to 10 mm.

In the fourth aspect of the present invention, there is provided a process as recited above, wherein the sputtering is conducted in an atmosphere while introducing thereinto a gas containing at least any one of oxygen, nitrogen and hydrogen.

In the fifth aspect of the present invention, there is provided a process as recited above, wherein the plasma is generated over the film source material by radio frequency power.

In the sixth aspect of the present invention, there is provided a process for producing a thin film which comprises providing $MgF_2$, preferably, $MgF_2$ in the form of granules having an average grain size of 0.1 to 10 mm as a film source material, generating plasma over the $MgF_2$ by alternating current power, preferably, radio frequency power in an atmosphere while introducing thereinto at least one gas selected from the group consisting of oxygen and nitrogen so that the $MgF_2$ has its surface heated at a constant temperature ranging from 650 to 1100° C. by the plasma, causing positive ions to sputter the $MgF_2$ so that at least a part of the $MgF_2$ is ejected in molecular form and depositing the $MgF_2$ in molecular form on a substrate to thereby form a thin film on the substrate.

In the seventh aspect of the present invention, there are provided thin films produced by the above processes.

Each of these thin films is used as a monolayer antireflection coating film or combined with a layer of high refractive index or the like for use as an optical thin film of variable performance such as an antireflection coating film, a beam splitter or a filter.

In the eighth aspect of the present invention, each thin film has a composition of $MgF_x$ wherein x is a number ranging from 1.8 to 1.95 and which is not crystallized.

In the ninth aspect of the present invention, there is provided an optical instrument comprising an optical part comprising each of the above thin films.

With respect to the first aspect of the present invention, further description will be made below.

In the conventional sputtering process, it has been required that collision of ions with a target break interatomic bonds of the target to thereby cause atoms to be ejected from the target. Thus, part of the energy of accelerated ions is consumed in breaking interatomic bonds, so that the sputtering yield is lowered with the unfavorable result that the film formation is slow.

By contrast, in the present invention, the temperature of the film source material as a target is raised to thereby weaken interatomic bonds of the target prior to the collision of ions with the target. Therefore, most of the energy of accelerated ions is used in the sputtering, so that the sputtering yield is enhanced with the favorable result that the film formation can be very rapid as compared with that of the conventional sputtering process.

Moreover, in the conventional sputtering process, interatomic bonds are broken to thereby cause atoms to be ejected from the target.

By contrast, in the present invention, an increase of the temperature of the film source material excites thermal vibration to thereby form zones of strong bonds and zones of weak bonds, so that particles may be ejected from the target in molecular form. The terminology "molecular form" used herein means not only a monomolecular form but also a polymolecular form constituting a cluster aggregate. The form of each molecule ejected from the target would be substantially identical with that of each molecule evaporated by heating.

With respect to the second aspect of the present invention, further description will be made below.

Sputtering the film source material by positive ions while applying an alternating voltage to an electrode having the film source material disposed thereon to thereby cause the electrode to have a negative potential is based on the same principle as in the generally known radio frequency sputtering. The terminology "radio frequency" used herein means not only customary 13.56 MHz radio frequency but also medium frequency of tens of kilohertz (kHz).

Although with respect to the first aspect of the present invention the means for heating the film source material is not particularly limited, that is, the heating can be conducted by any of resistance heating, induction heating and an infrared heater, in the sputtering according to the second aspect of the present invention, alternating current power is applied to the electrode having the film source material disposed thereon so as to generate plasma over the film source material to thereby cause the surface of the film source material to have its temperature raised by the plasma.

With respect to the third aspect of the present invention, further description will be made below.

When the film source material is in the form of granules, the temperature thereof can easily be raised because of poor heat conduction and centralization of electric and magnetic fields on a large number of edge portions present in the target.

When the granules are too small in size, these are easily dislodged and are converted to particles in the vacuum vessel. Therefore, it is preferred that the average grain size of the granules be at least 0.1 mm, especially, at least 0.5 mm. On the other hand, when the granules are too large in size, the adiabatic effect thereof is lowered and the number of edge portions is reduced to thereby decrease the effect of the centralization of electric and magnetic fields. Therefore, it is preferred that the average grain size of the granules be not greater than 10 mm, especially, not greater than 5 mm. The granules do not necessarily have to be uniform in grain size and configuration.

With respect to the fourth aspect of the present invention, further description will be made below.

In optical uses, it is generally preferred that the light absorption of the thin film be low. Therefore, when the composition of the film source material is identical with that of the desired thin film, particles ejected from the film source material are preferred to be in molecular form rather than to be in atomic form resulting from complete dissociation. For completely dissociated matter is not always restored to the original.

As a result of extensive and intensive studies, it has been found that the form of particles ejected from the film source material depends on the type of gas introduced in the sputtering. An inert gas such as Ar customarily employed in the sputtering is likely to cause particles ejected from the film source material to break up into atomic form. On the other hand, oxygen, nitrogen, hydrogen and gases containing these cause such particles to be ejected from the film source material in molecular form without being broken up. Therefore, introduction of a gas containing at least one member selected from the group consisting of oxygen, nitrogen and hydrogen is preferred especially in the production of optical thin films.

Figure 14:
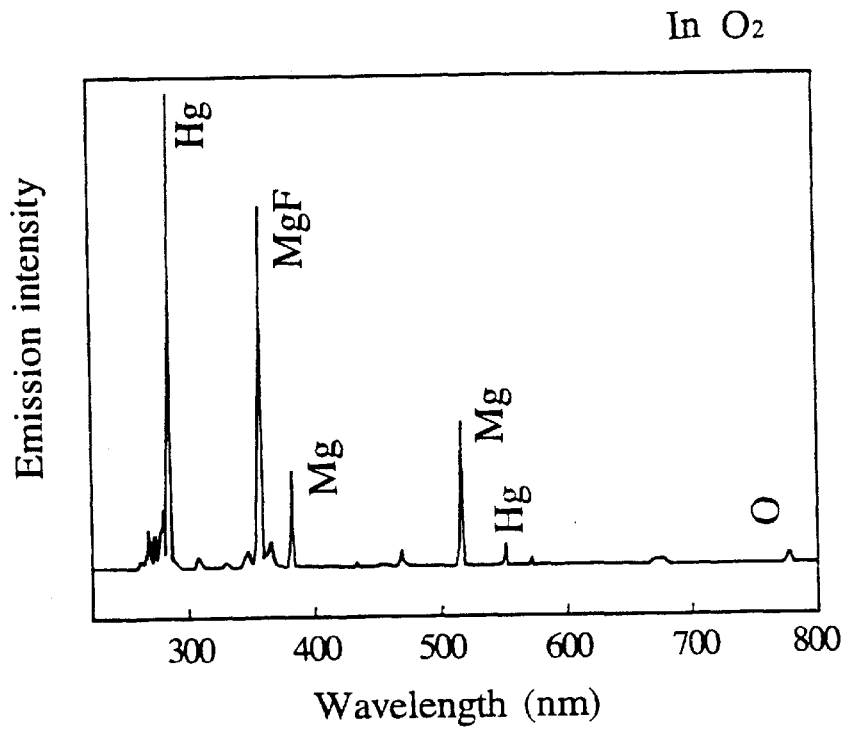
FIGS. 14(*a*) and 14(*b*) show plasma emission spectra obtained by sputtering with introduction of oxygen on the one hand and without introduction of oxygen on the other hand.
Figure 14:
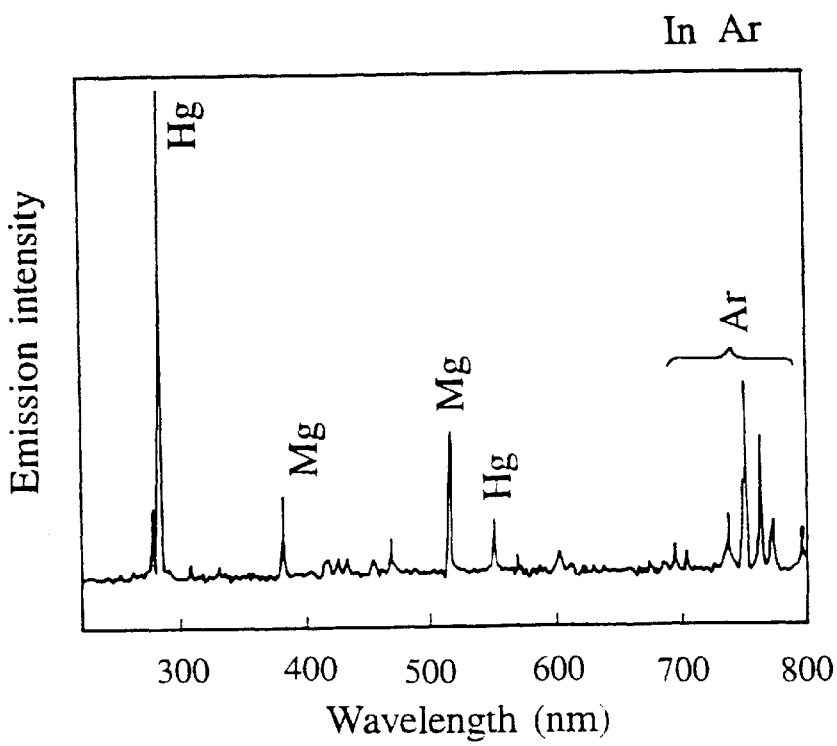

For example, FIG. 14 (a) shows a plasma emission spectrum in which the emission intensity is plotted against wavelength with respect to the sputtering carried out while introducing oxygen. In the figure, not only peaks ascribed to atomic Mg and O but also a peak ascribed to molecular MgF is observed. On the other hand, FIG. 14 (b) shows a plasma emission spectrum in which the emission intensity is plotted against wavelength with respect to the sputtering carried out while introducing argon only. In this figure, no peak ascribed to molecular MgF is observed.

Oxygen, nitrogen, hydrogen and gases containing these would be used only in the sputtering of the film source material, and the probability is nearly zero that they combine with the film source material. Therefore, the optical thin film produced by the sputtering while introducing such gases would have a composition substantially identical with that of the thin film formed on a substrate by heating the film source material to thereby evaporate the same.

There is no particular limitation on the film source material. Basically, any kind of film source material can be used. A suitable film source material can be selected according to use. For example, a fluoride, an oxide, a nitride or a sulfide can be employed in the formation of an optical thin film.

With respect to the fifth and sixth aspects of the present invention, further description will be made below.

When the film source material is a conductor such as a metal, both direct current power and alternating current power can be used for generating plasma over the film source material to thereby conduct sputtering. However, when the film source material is an insulator such as $MgF_2$, alternating current power must be used. It is preferred to employ radio frequency power among alternating current power varieties. The reason is that the use of radio frequency power produces stronger negative bias on the film source material because of the difference in mobility between electrons and positive ions.

Therefore, in the sputtering conducted while generating plasma over the film source material by radio frequency power, not only a conductor such as a metal but also a dielectric substance can be used as the film source material.

In the sputtering of $MgF_2$ especially suitable for formation of an optical thin film, the rate of deposition for film formation can be very high as long as the temperature of the surface of the target is 650° C. or higher.

On the other hand, when the temperature is 1100° C. or higher, the vapor pressure of the film source material is increased so as to be as high as the pressure of the introduced gas with the result that evaporated molecules directly reach the substrate. In that case, there would be no difference from the customary vacuum evaporation. The vacuum evaporation would provide a thin film of poor scuff resistance as different from from that obtained by the sputtering process.

In the customary vacuum evaporation of $MgF_2$, the substrate must be heated up to about 300° C. because otherwise the thin film would have extremely poor scuff resistance and thus would not be able to serve practical use. However, a thin film of high scuff resistance can be obtained irrespective of the temperature of the substrate when the temperature of the surface of the target is held at 1100° C. or below in the present process. Among the above introduced gases, oxygen and nitrogen are preferred from the viewpoint of economy, availability and safety.

Occasionally, the self-sputtering phenomenon would occur in which molecules ejected from the target material collide with electrons present in the plasma to thereby form positive ions and thereafter collide with the target to thereby effect the sputtering. When the film source material is $MgF_2$, the form of particles ejected from the target by the self-sputtering would be molecular, so that the phenomenon would not cause any particular problem.

With respect to the seventh to ninth aspects of the present invention, further description will be made below.

The thus produced optical thin film is nearly stoichiometric and is substantially free of light absorption in the visible region, and its refractive index is approximately 1.38. Therefore, this optical thin film has satisfactory antireflective effect even if it is in the form of a monolayer and can be used as an antireflection coating film in optical parts and instruments such as a lens, a prism, optical fibers, spectacles, sunglasses and goggles, displays such as a cathode ray tube and a liquid crystal device, window materials, screens, etc. Moreover, this thin film can be combined with a film of high refractive index so as to form a multilayer structure, thereby providing an antireflection coating film of superior performance or an optical thin film such as a half mirror or an edge filter.

As described above, it is not necessary to heat the substrate in the present invention, so that there is no particular limitation on the material of the substrate. That is, the substrate can be composed of any material, e.g., a glass such as an optical glass or a window glass, any of various resins such as PMMA, polycarbonate and polyolefins, a metal or a ceramic. The shape of the substrate is also not particularly limited and it may be film like, spherical, or plate like.

EFFECT OF THE INVENTION

The process according to the first to sixth aspects of the present invention has the effect that a solid film source material is heated in advance and sputtered, so that most of the energy of accelerated ions is used in the sputtering, thereby rendering the sputtering yield high. As a result, the film formation can be much faster than in the conventional process. Moreover, in the present invention, an increase of the temperature of the film source material excites thermal vibration to thereby form zones of strong bonds and zones of weak bonds, so that particles are ejected from the target in molecular form. Therefore, a thin film of substantially the same composition as that of the starting film source material can be formed without suffering from dissociation even if the film source material is one which is completely dissociated in the customary sputtering. The process of the present invention is especially effective in the formation of an optical thin film of a fluoride such as $MgF_2$ according to the sputtering process and enables easily obtaining a coating film of low refractive index which is free of light absorption.

Preferred Embodiment of The Invention

The present invention will now be described in greater detail with reference to the following Embodiments and Comparative Examples, which should not be construed as limiting the scope of the invention.

Figure 3:
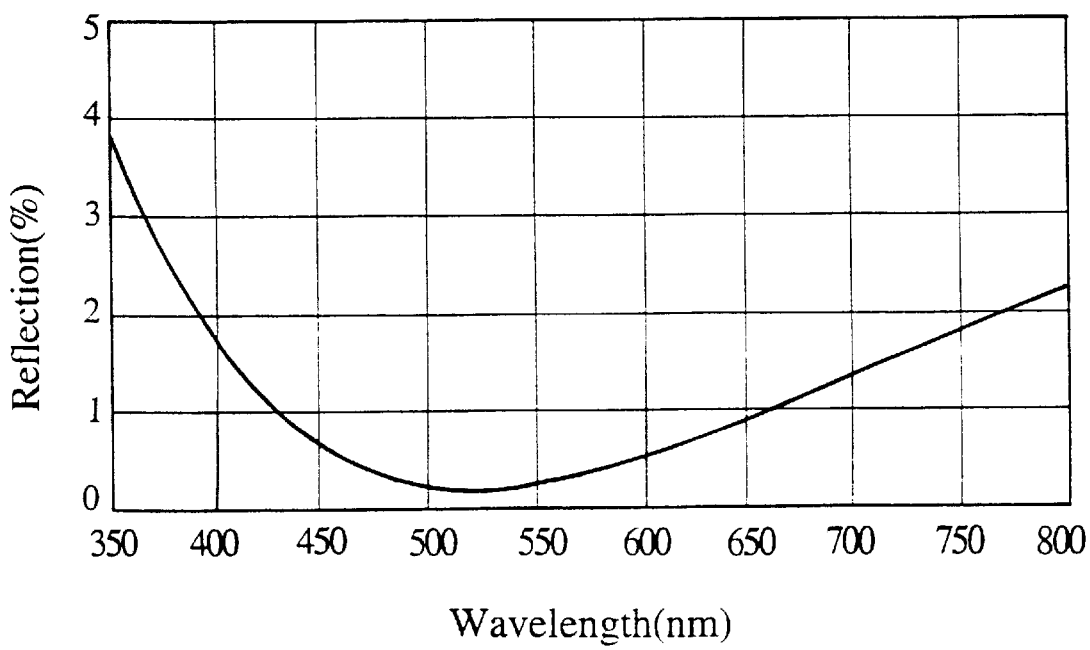
FIG. 3 is a graph showing the relationship between wavelength and reflection measured in Embodiment 1 of the present invention.
Figure 2:
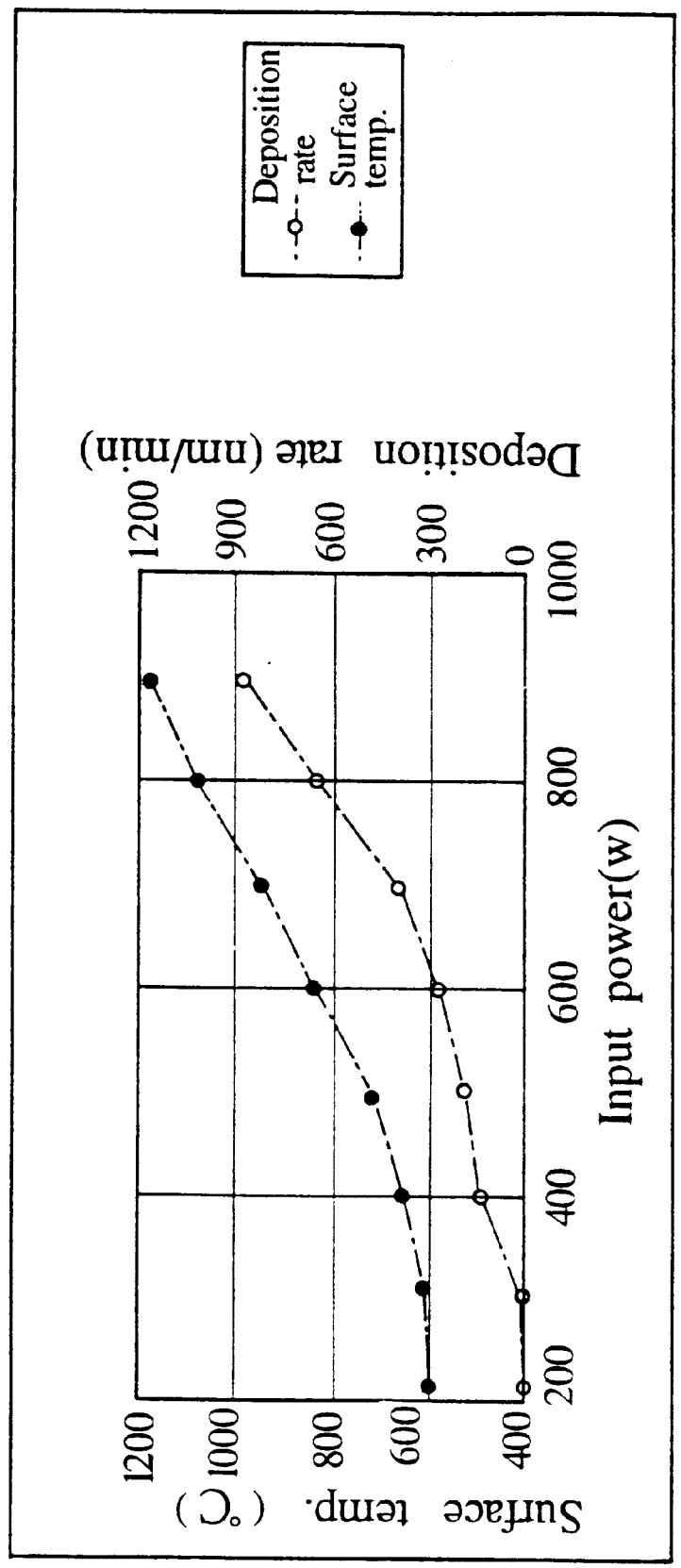
FIG. 2 is a graph showing the relationship between input power and surface temperature measured in Embodiment 1 of the present invention.
Figure 4:
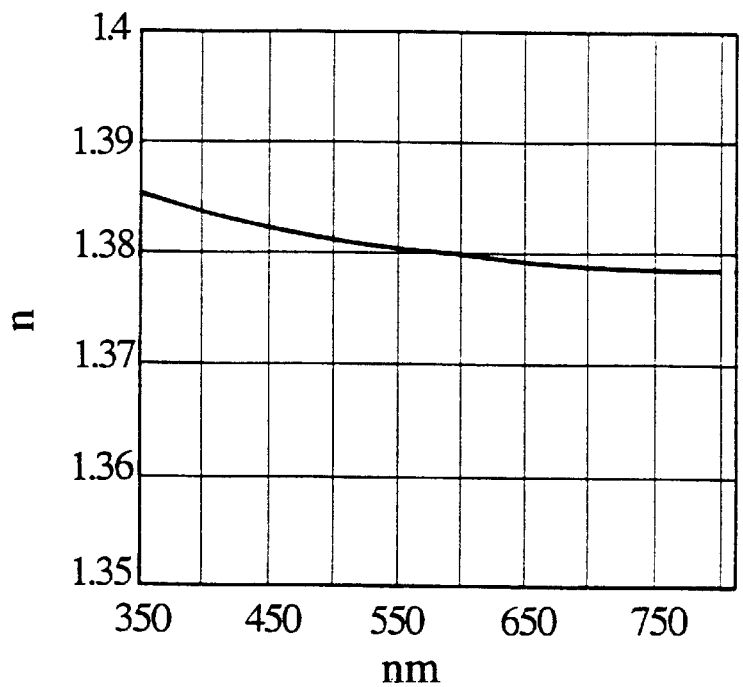
FIG. 4 is a graph showing the relationship between wavelength and refractive index measured in Embodiment 1 of the present invention.
Figure 5:
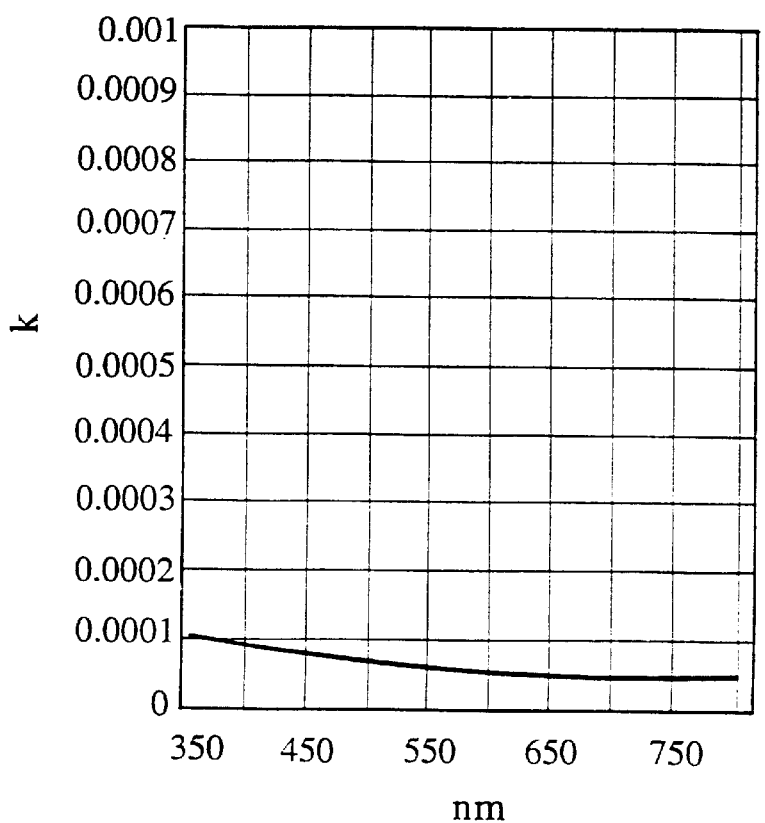
FIG. 5 is a graph showing the relationship between wavelength and absorption coefficient measured in Embodiment 1 of the present invention.

FIG. 1 is a schematic diagram of the structure of the apparatus employed in Embodiment 1; FIG. 2 a graph showing the relationship between input power and surface temperature measured in Embodiment 1; FIG. 3 a graph showing the relationship between wavelength and reflection measured in Embodiment 1; FIG. 4 a graph showing the relationship between wavelength and refractive index measured in Embodiment 1; FIG. 5 a graph showing the relationship between wavelength and absorption coefficient measured in Embodiment 1; and FIG. 6 a graph showing the relationship between input power and surface temperature measured in Comparative Example 1.

Embodiment 1.

In FIG. 1, numeral 1 denotes a vacuum chamber. A substrate 2 was rotatably set in the vacuum chamber 1 at an upper part thereof. $MgF_2$ granules 3 of 1 to 5 mm in grain size as a film source material were placed in a quartz boat 4 and mounted on a magnetron cathode 5 of 4 inch (about 100 mm) in diameter.

The magnetran cathode 5 was connected through a matching box 6 to a 13.56 MHz radio frequency power source 7.

Cooling water 8 maintained at 20±0.5° C. was caused to flow on a lower face of the magnetron cathode 5 so that the temperature of the magnetron cathode 5 was held constant. A side wall of the vacuum chamber 1 was provided with gas introduction ports 9, 10 for introducing gas in the vacuum chamber 1. Further, a shutter 11 was provided between the magnetron cathode 5 and the substrate 2. The substrate 2 was not provided with a heater and was not heated at all.

For the production of a thin film with the use of the apparatus of the above structure, an La optical glass of 1.75 in refractive index was set as the substrate 2, and the vacuum chamber 1 was evacuated to $7 \times 10^{-5}$ Pa. Then, $O_2$ gas was introduced through the gas introduction port 9 into the vacuum chamber 1 so that the internal pressure of the vacuum chamber 1 was $4 \times 10^{-1}$ Pa. Subsequently, the magnetron cathode 5 was supplied with power by the radio frequency power source 7, thereby generating plasma. The $MgF_2$ granules 3 were heated by the plasma with their temperature plasma heating and cooling by cooling water 8 flowing on the lower wall of the magnetron cathode 5 and thus sputtered.

In this situation, the substrate 2 was rotated and the shutter 11 was opened while continuing the rotation, so that an $MgF_2$ film was formed on the substrate 2. When the optical film thickness increased so as to be 130 nm, the shutter 11 was closed.

Plasma emission spectra obtained during the film formation were analyzed with respect to the wavelength. When the input power was 400 W or higher, emission was recognized not only from Mg atoms but also from MgF molecules. Thus, it was confirmed that at least part of the film source material was ejected (sputtered) in molecular form.

FIG. 2 shows what changes of the surface temperature of granules 3 and the rate of deposition for film formation on the substrate 2 are brought about by changes of the input power. When the input power is 400 W or higher, it is seen that the surface temperature of granules 3 rises to about 650° C. or higher with the result that the rate of deposition for film formation is rapidly increased. When the input power is 800 W, the surface temperature of granules 3 rises to about 1100° C.

The coating films formed with 400 to 800 W input power were analyzed by EPMA. As a result, it was found that, with respect to the component proportion, Mg:F was 1:1.8 to 1.95 and the F content was increased with the increase of the input power. Further, it was confirmed that oxygen introduced as a process gas was substantially not present in the coating films. Moreover, as a result of FT-IR analysis, the bond between Mg and F was recognized but the bond between Mg and O (oxygen) was not recognized in the coating films.

Figure 15:
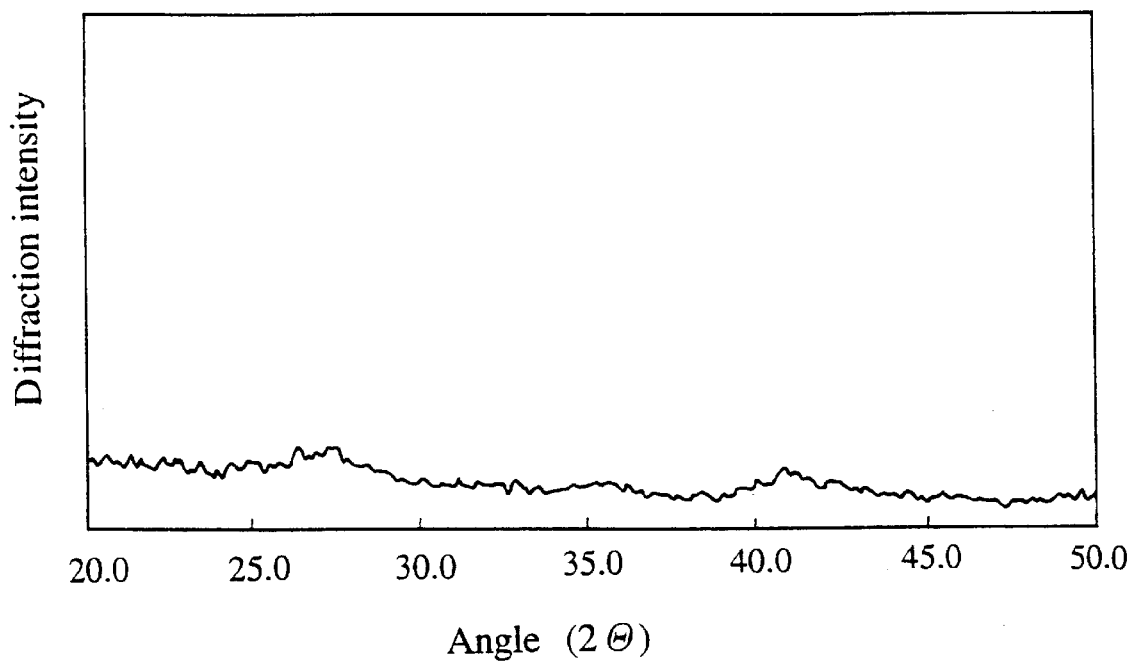
FIGS. 15(a) and 15(b) show XRD measurement data with respect to thin films obtained by the present invention on the one hand and by the conventional vacuum evaporation.
Figure 15:
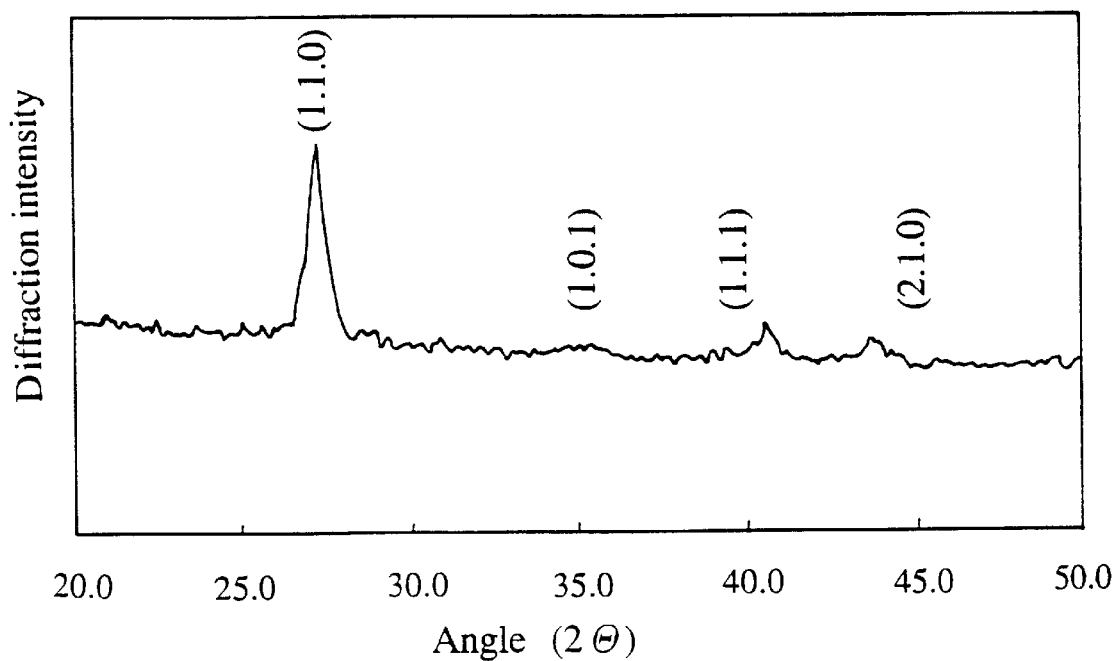

Still further, XRD analysis was conducted. The crystallization was hardly observed and no clear peak ascribed to crystal was recognized. FIG. 15 shows XRD measurement data. FIG. 15 (a) shows that the crystallization of the thin films of this Embodiment is slight, while FIG. 15 (b) shows that a thin film formed by the customary vacuum evaporation process has peaks ascribed to crystallization.

Each coating film was subjected to a tape peeling test in which a cellophane tape was caused to adhere to the coating film and a peeling force was applied at an angle of 90°. With respect to all the coating films produced in varied conditions, peeling of the coating film from the substrate did not occur. Further, each coating film was subjected to a scuff resistance test in which the coating film was rubbed with a lens cleaning paper wetted with alcohol and the surface of the rubbed coating film was visually inspected. In this test, the coating films produced with less than 800 W input power were completely free of flaws but the coating film produced with 800 W input power was observed to have suffered from slight flaw. Further, with respect to the coating film produced with 900 W input power, it easily peeled from the substrate.

With respect to an antireflection coating film produced by the above procedure of this Embodiment, the spectral reflection was measured and also the refractive index n and absorption coefficient k were measured according to the spectroellipsometry. Measurement results are shown in FIGS. 3 to 5.

The reflection dropped to 0.2% or less at the central wavelengths, so that it can be stated that the coating film has excellent antireflection properties.

The refractive index n was about 1.38 and the absorption coefficient k was not greater than $10^{-4}$ so that it can be stated that these are at a practical level from the viewpoint of the use of the coating film as an optical film of low refractive index.

Similar results were obtained as long as use was made of granules having a grain size ranging from 0.1 to 10 mm, and no problem was caused in this Embodiment.

Antireflection coating films with excellent optical characteristics and durability were obtained as long as the pressure of introduced oxygen ($O_2$) gas ranged from $5 \times 10^{-2}$ to $5 \times 10^0$ Pa, although the required input power had to be slightly varied.

COMPARATIVE EXAMPLE 1

Figure 6:
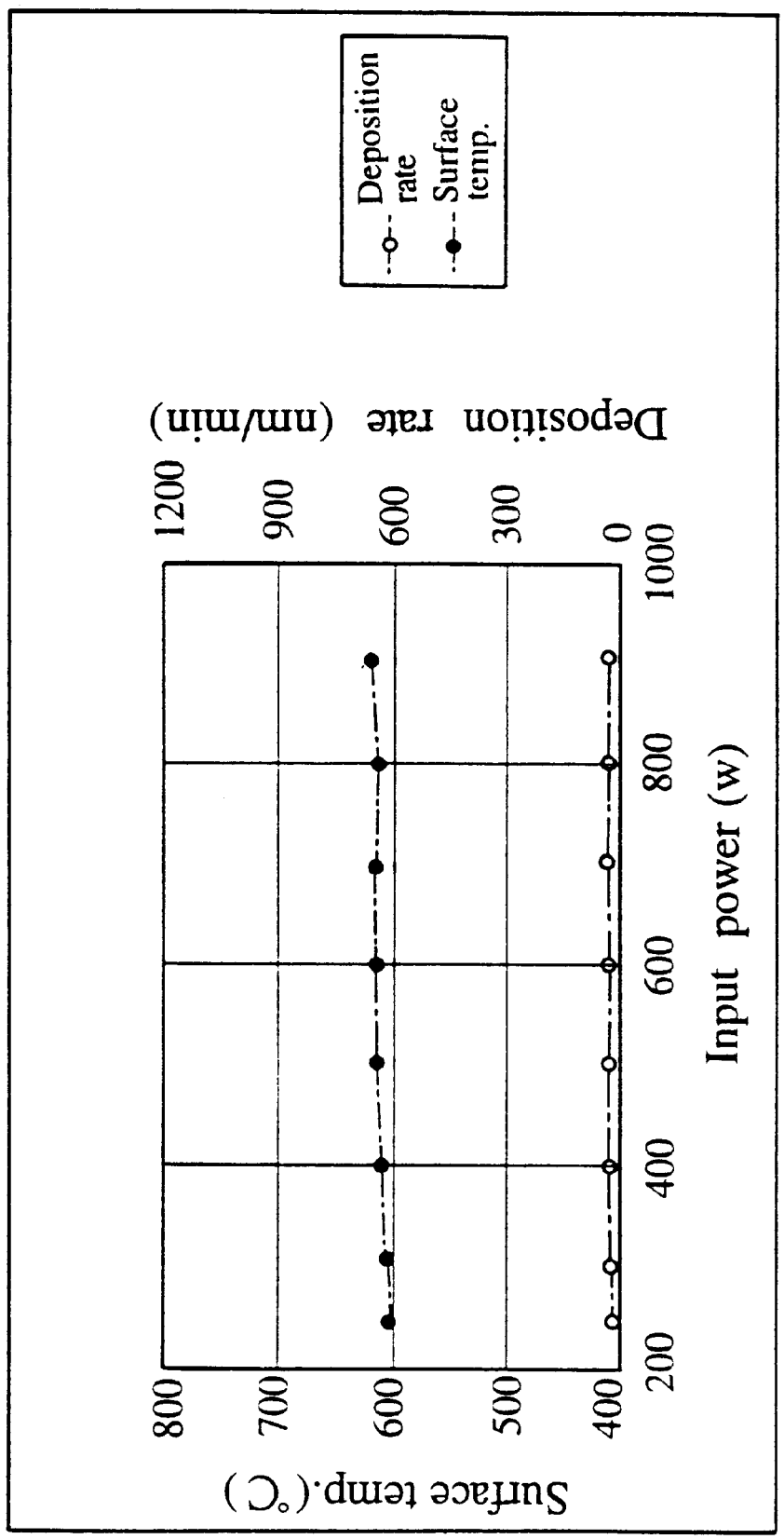
FIG. 6 is a graph showing the relationship between input power and surface temperature measured in Comparative Example 1.

Similar experiment was conducted with the use of sintered $MgF_2$ in place of $MgF_2$ granules 3. FIG. 6 shows the relationships between input power and surface temperature and between input power and rate of deposition for film formation as measured.

With the use of sintered $MgF_2$, as different from the use granules, the heating thereof was not effective and the temperature rise was slight irrespective of the employment of high input power. Illustratively, the sputtering was the same as conventionally carried out and the rate of deposition for film formation was too low to be practicable. For example, although the film formation took only 18 sec with 600 W input power in Embodiment 1, 11 min was required for obtaining the same film thickness in this Comparative Example.

The thin film produced in this Comparative Example had absorption in visible region, so that the optical use thereof was impracticable.

With respect to the component proportion of the thin film produced in this Comparative Example, it was confirmed that Mg:F was 1:1.5 to 1.7 with the F content being conspicuously deficient. Further, it was confirmed that the thin film had relatively high crystallinity.

COMPARATIVE EXAMPLE 2

$MgF_2$ coating films were produced by the widely employed conventional vacuum evaporation process, in which in the one instance the substrate was not heated at all and in the other instance the substrate was heated at 300° C. In both the instances, the light absorption of the thin film was slight and, with respect to the component proportion thereof, Mg:F was 1:1.9 to 2.0. When the substrate was not heated, the thin film had low crystallinity and extremely poor scuff resistance. However, when the substrate was heated at 300° C., the thin film had high crystallinity and high scuff resistance which were at the practicable levels.

Embodiment 2

With the use of the same apparatus as in Embodiment 1, $N_2$ was introduced through the gas introduction port 9 to $1 \times 10^{-2}$ Pa and Ar introduced through the gas introduction port 10 to $3 \times 10^{-2}$ Pa. The temperature rise was relatively low as compared with Embodiment 1 and the target surface temperature was increased to 650° C. or higher with at least 500 W input power. The spectral reflection of the coating film formed on a substrate under the conditions such that the input power was 650 W and the film formation time was 21 sec was exactly the same as exhibited in FIG. 3. The coating film had a light absorption in the visible region of up to 1% which was fully on the practicable level. The same tests as in Embodiment 1 were conducted. In the tape peeling test, the coating film did not peel from the substrate. In the scuff resistance, the coating film did not suffer from flaws.

In place of $MgF_2$, use was made of LiF, $CaF_2$, $SrF_2$, $AlF_3$, $GaF_3$, $InF_3$, mixtures thereof and mixtures of these and $MgF_2$. All the produced coating films had no light absorption and were excellent in adherence and scuff resistance although the required input powers were different from each other. All of these had a refractive index as low as about 1.4 and the coating films could be used as monolayer antireflection coating films.

Embodiments 3 to 5

Figure 7:
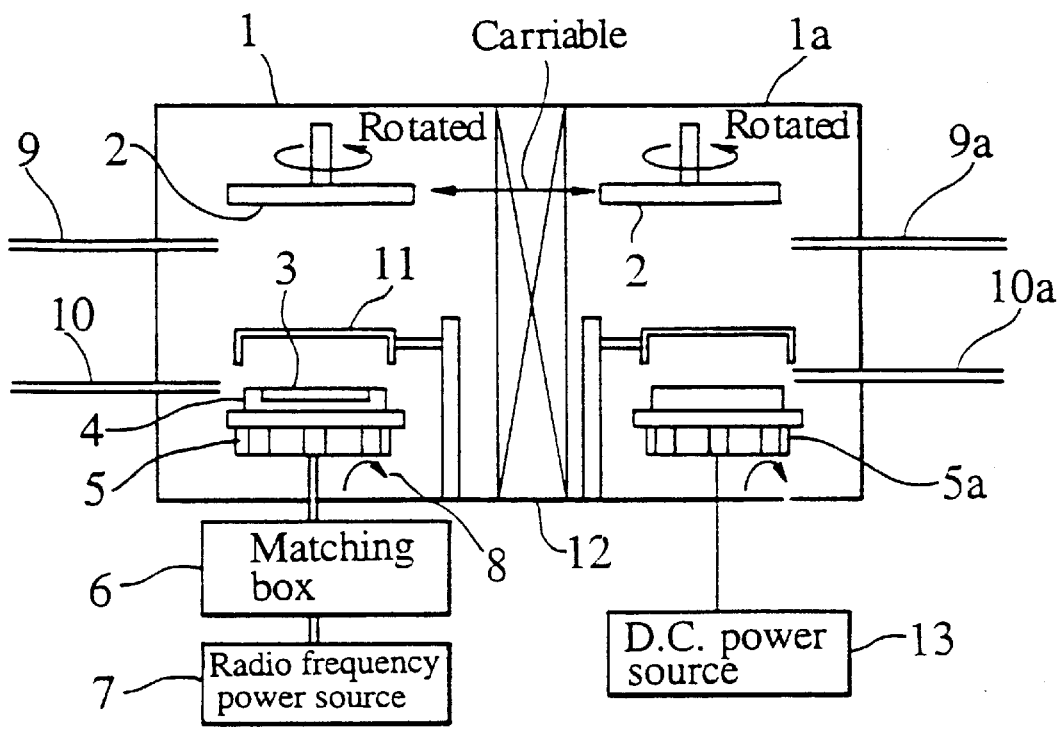
FIG. 7 is a schematic diagram of the structure of the apparatus employed in Embodiments 3 to 5 of the present invention.

FIG. 7 is a schematic structural view of the apparatus employed in these Embodiments.

Referring to FIG. 7, the apparatus comprises the vacuum chamber 1 as employed in Embodiment 1 and, connected therewith through a partition gate valve 12, another vacuum chamber 1a similar to the above vacuum chamber 1. The apparatus is so structured that the substrate 2 can be moved between the vacuum chamber 1 and the vacuum chamber 1a by means of a carrier not shown.

The film formation was conducted in the same manner as in Embodiment 1 in the vacuum chamber 1 of the apparatus with the above structure. In the vacuum chamber 1a, a plate of a metal selected from among Ti, Ta and Zr was used as a target. A magnetron cathode 5a was connected to a direct current power source 13. $O_2$ and Ar were introduced through gas introduction ports 9a, 10a, respectively, and a high refractive index film of a member selected from among $TiO_2$, $Ta_2O_5$ and $ZrO_2$ was formed on the substrate 2 according to the DC reactive sputtering process.

Antireflection coating films and a half mirror were produced by forming alternate layers of $MgF_2$, $TiO_2$, $Ta_2O_5$ and $ZrO_2$ having respective desired thicknesses on the substrate 2 in the vacuum chamber 1 and vacuum chamber 1a of the apparatus, as specified in Table 1. The spectral characteristics thereof are shown in FIGS. 8 to 10.

TABLE 1

Figure 8:
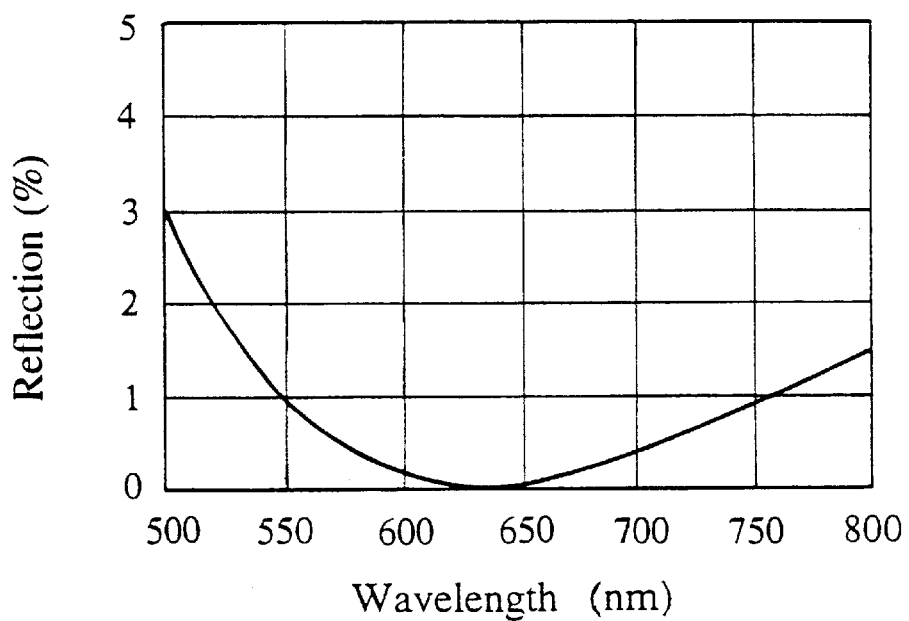
FIG. 8 is a graph showing the relationship between wavelength and reflection measured in Embodiment 3 of the present invention.
Figure 9:
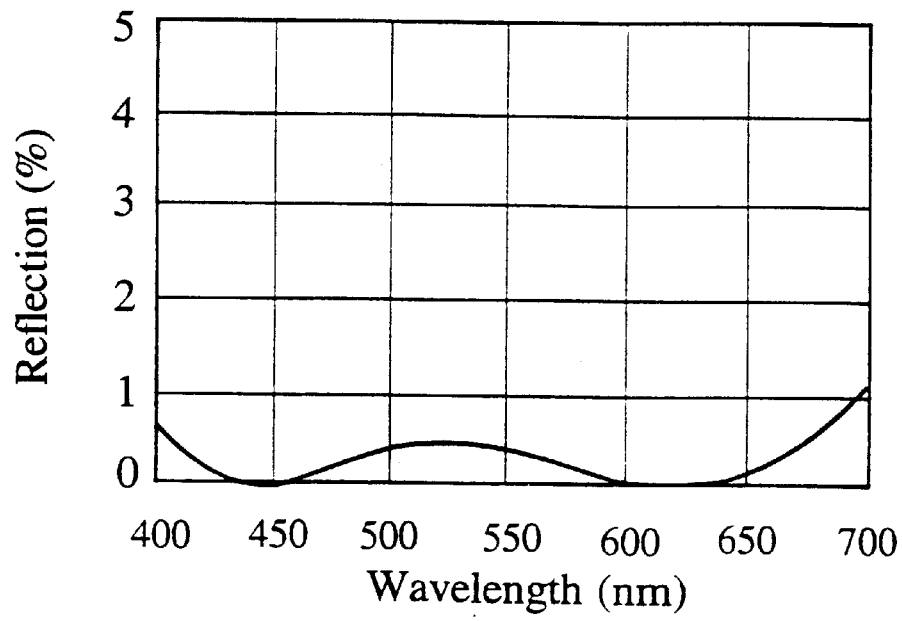
FIG. 9 is a graph showing the relationship between wavelength and reflection measured in Embodiment 4 of the present invention.
Figure 10:
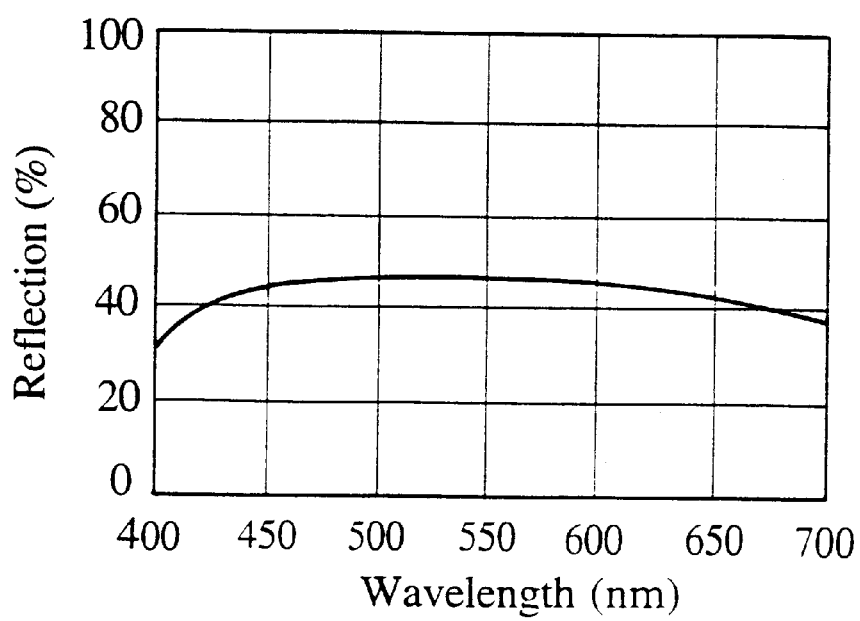
FIG. 10 is a graph showing the relationship between wavelength and reflection measured in Embodiment 5 of the present invention.

| | Embodiment 3 Fig. 8 (antireflection film) | | Embodiment 4 Fig. 9 (antireflection film) | | Embodiment 5 Fig. 10 (half mirror) | |
|---|---|---|---|---|---|---|
| film structure [mat'l/optical film thickness] | | nd (nm) | | nd (nm) | | nd (nm) |
| | | | $MgF_2$ | 125 | $MgF_2$ | 130 |
| | | | $Ta_2O_5$ | 265 | $TiO_2$ | 130 |
| | | nd (nm) | $MgF_2$ | 50 | $MgF_2$ | 130 |
| | $MgF_2$ | 200 | $Ta_2O_5$ | 30 | $TiO_2$ | 130 |
| | $ZrO_2$ | 50 | $MgF_2$ | 45 | $MgF_2$ | 130 |
| substrate | end face of optical fiber | | CRT glass | | polycarbonate resin | |

With respect to the antireflection coating film having the spectral characteristics of FIG. 8, the reflection was nearly zero at a wavelength of 630 nm, thereby ensuring excellent antireflective effect at a single wavelength.

With respect to the antireflection coating film having the spectral characteristics of FIG. 9, the reflection was substantially up to 1% throughout the entire visible region of 400 to 700 am in wavelength, thereby ensuring such excellent performance that satisfactory use can be made not only in CRT but also in high-precision optical instruments such as a camera and a microscope.

With respect to the half mirror having the spectral characteristics of FIG. 10, the reflection was 40 to 45% in a range of wavelength as wide as from 450 to 650 nm, thereby exhibiting flat performance, despite the number of layers being as small as 5.

Embodiment 6

The coating films of $TiO_2$, $Ta_2O_5$ and $ZrO_2$ oxides as in Embodiments 3 to 5 were produced with the use of the apparatus of FIG. 1 in the same manner as in Embodiment 1. $TiO_2$, $Ta_2O_5$ and $ZrO_2$ granules as the film source materials were placed in the boat 4 of the apparatus of FIG. 1. With respect to these materials, the rate of deposition for film formation was not increased unless there was a conspicuous rise of the material temperature. Accordingly, the temperature of the cooling water 8 was set high, for example, about 80° C. and the flow rate of the cooling water was decreased, for example, from the customary about 8 liters/min to about 3 liters/min.

With respect to other oxides such as $WO_3$, $In_2O_3$, $SiO_2$, $SnO_2$ and mixtures thereof, the film formation could be performed at a high rate by following exactly the same manner as in Embodiment 1 without the need to effect the above modifications.

Embodiment 7

Use was made of the apparatus of FIG. 7.

An optical glass prism was employed as the substrate 2. In the vacuum chamber 1, ZnS granules 3 of 0.1 to 10 mm in grain size as the film source material were put in a Pyrex glass boat 4 and mounted on the magnetron cathode 5. The vacuum chamber 1 was evacuated, and $H_2$ and $O_2$ gases were introduced through the gas introduction port 10 to 1×10$^{-2}$ Pa and 2×10$^{-1}$ Pa, respectively.

The magnetron cathode 5 was supplied with 350 W power by the 13.56 MHz radio frequency power source 7 to thereby generate plasma. The ZnS granules 3 were heated by this plasma so that the temperature thereof was increased to about 600° C. Thereafter, the shutter 11 was opened and a ZnS coating film was formed on the substrate 2. In the formation of the thin film according to this process, the formation rate was as extremely high as 150 nm/min.

In the vacuum chamber 1a, an Ag plate was used as the target. Ar was introduced through the gas introduction port 10a and an Ag coating film was formed on the substrate 2 according to the DC sputtering process.

Figure 11:
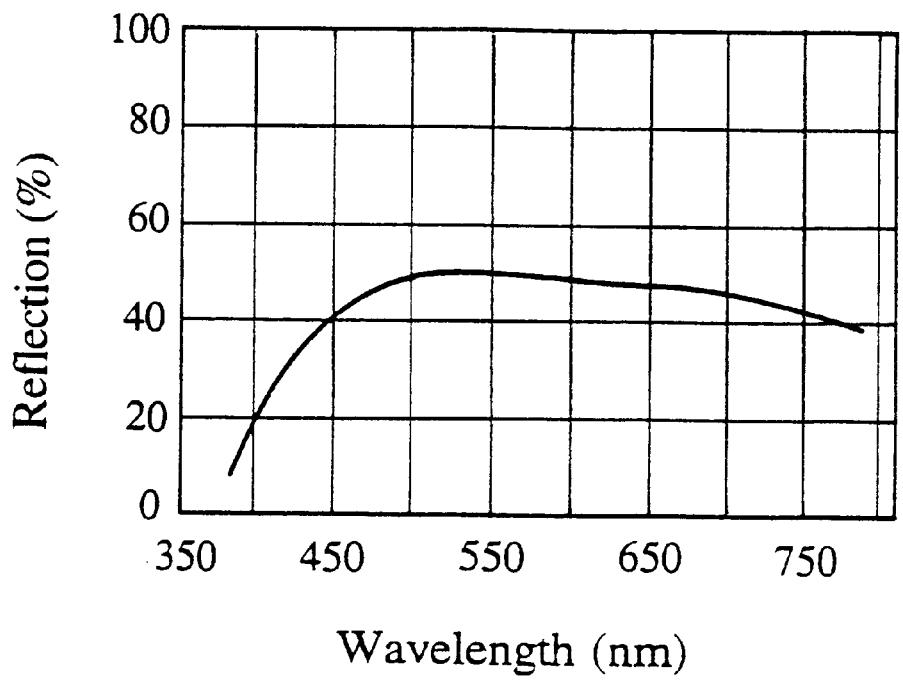
FIG. 11 is a graph showing the relationship between wavelength and reflection measured in Embodiment 7 of the present invention.

After the formation of the ZnS and Ag coating films on the prism in the vacuum chamber 1 and the vacuum chamber 1a, respectively, this prism was bonded to another prism having no coating film to thereby obtain a beam splitter. The coating film structure is given in Table 2 and the spectral characteristics of the coating film at a light incidence angle of 45° from the coating film are shown in FIG. 11.

TABLE 2

|  | Material | Optical film thickness nd |
|---|---|---|
| 1st layer | ZnS | 160 nm |
| 2nd layer | Ag | 50 nm |
| substrate | optical glass | |

The reflection was 40 to 50% in a range of wavelength as wide as from 450 to 750 nm, thereby exhibiting relatively flat performance, despite the number of layers being as small as 2.

Embodiment 8

Use was made of the apparatus of FIG. 1.

SiO granules 3 of 0.1 to 10 mm in grain size as the film source material were placed in a Cu boat 4 and mounted on the magnetron cathode 5. The vacuum chamber 1 was evacuated, and Ar gas was introduced through the gas introduction port 9 to 3 Pa. The magnetron cathode 5 was supplied with 350 W power by the 27.12 MHz radio frequency power source 7 to thereby generate plasma. The SiO granules 3 were heated by this plasma so that the temperature thereof was increased to about 500° C.

Thereafter, the shutter 11 was opened and an SiO coating film was formed on the substrate 2. In the formation of the thin film according to this process, the rate of deposition for film formation was as extremely high as 230 nm/min.

The SiO coating film can be used not only as an optical thin film of high refractive index but also as a surface protective film or a moisture-proof film.

The process of this Embodiment is not limited to the formation of the SiO coating film and can also be employed in the formation of coating films of SiOn (n=1 to 2) inclusive of SiO$_2$.

Embodiment 9

Figure 12:
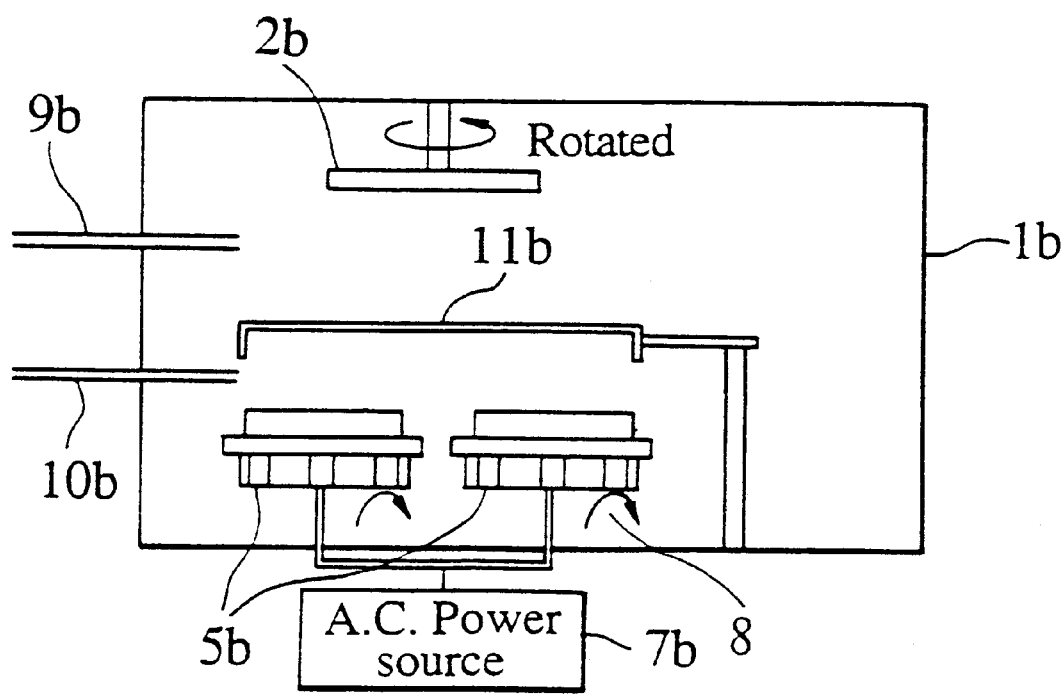
FIG. 12 is a schematic diagram of the structure of the apparatus employed in Embodiment 9 of the present invention.

FIG. 12 is a schematic structural view of the apparatus employed in this Embodiment.

A substrate 2b was autorotatably set in a vacuum chamber 1b at an upper part thereof. Two magnetron cathodes 5b were connected to a 400 kHz alternating power source 7b and were so structured that alternating voltages were applied at half-cycle intervals to the individual magnetron cathodes 5b. Sintered 6-inch ZnSe as a film source material was mounted on the magnetron cathodes 5b. Cooling water 8 was caused to flow on the respective lower walls of the magnetron cathodes 5b. A side wall of the vacuum chamber 1b was provided with two gas introduction ports 9b, 10b. Further, a shutter 11b was provided between the magnetron cathodes 5b and the substrate 2b.

The vacuum chamber 1b was evacuated, and Ar gas was introduced through the gas introduction ports to 0.6 Pa. The magnetron cathodes 5b were supplied with 1 kW power by the alternating power source 7b to thereby generate plasma. The ZnSe was heated by this plasma so that the temperature thereof was increased to about 470° C. Thereafter, the shutter 11b was opened and a ZnSe coating film was formed on the substrate 2b. In the formation of the ZnSe coating film according to this process, the rate of deposition for film formation was as extremely high as 310 nm/min.

Embodiment 10

Figure 13:
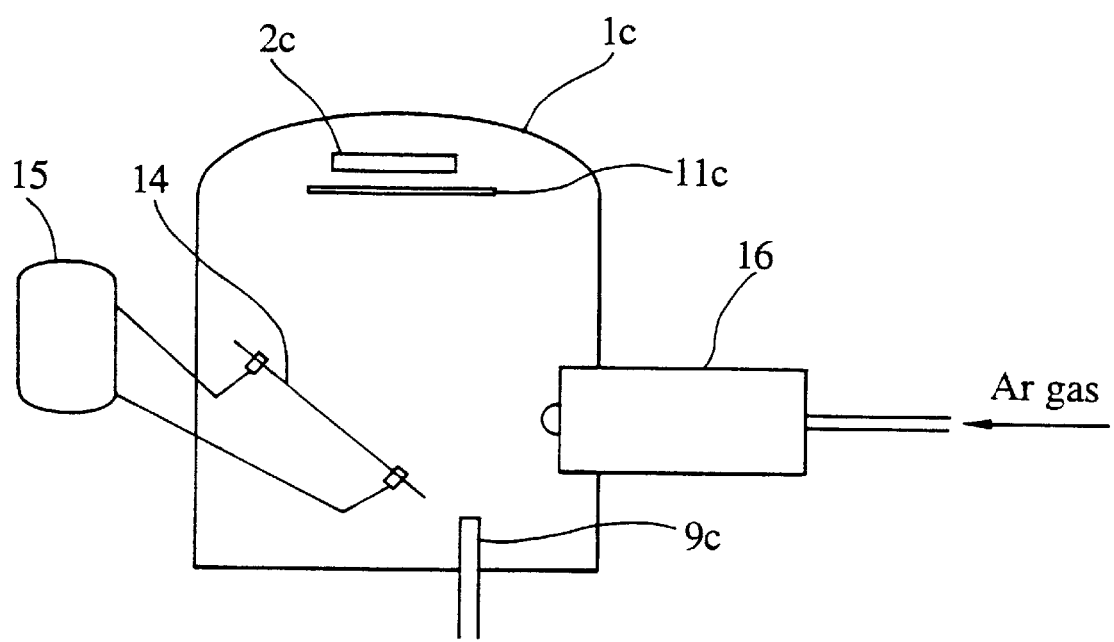
FIG. 13 is a schematic diagram of the structure of the apparatus employed in Embodiment 10 of the present invention.

FIG. 13 is a schematic structural view of the apparatus employed in this Embodiment.

A substrate 2c was set in a vacuum chamber 1c at an upper part thereof. An Al plate 14 as a film source material was so structured as to be heated to a desired temperature according to the resistance heating by passing current through the Al plate 14 by means of a heating power source 15. An ion gun 16 was aimed at the plate 14 and set so that ions were caused to collide with the plate 14, thereby sputtering the same, and that particles resulting from the sputtering reached the substrate 2c to thereby form a thin film.

The vacuum chamber 1c was evacuated and the Al plate was heated by means of the power source 15 so that the temperature thereof was increased to 500° C. Then, Ar ions accelerated by 1 kV acceleration voltage were emitted from the ion gun 16 to thereby sputter the Al plate. The shutter 11c was opened, so that an Al coating film was formed on the substrate 2c.

In the formation of the Al coating film according to this process, the rate of deposition for film formation was as extremely high as 300 nm/min. Further, the adherence and hardness of the coating film were also satisfactory.

Conducting the film formation while introducing oxygen or nitrogen through the gas introduction port 9c into the vacuum chamber 1c enables forming a coating film of Al oxide or nitride on the substrate 2c.

What is claimed is:

1. A process for producing a thin film comprising:
   heating a surface of a film source material consisting essentially of a fluoride so that at least a part of the film source material can be ejected in molecular form by ion sputtering, the heating effected by supplying a magneton cathode on which the film source material is placed as a target with input power in an amount of 400 to 800 w per 4 inches of diameter of the magneton cathode;
   causing ions to sputter the film source material in an atmosphere while introducing thereinto a gas containing at least any one of oxygen, nitrogen and hydrogen to thereby attain at least partial ejection of the film source material in molecular form; and depositing the film source material in molecular form on a substrate to thereby form a thin film of fluoride free of bonding with the gas on the substrate.

2. The process according to claim 1, wherein the film source material is sputtered by positive ions while not only applying an alternating voltage to an electrode having the film source material disposed thereon to thereby cause the electrode to have a negative potential but also applying alternating current power so as to generate plasma over the film source material to thereby cause the surface of the film source material to have its temperature raised by the plasma.

3. The process according to claim 2, wherein the plasma is generated over the film source material by radio frequency power.

4. The process according to claim 2, wherein the film source material is in the form of granules having an average grain size of 0.1 to 10 mm.

5. The process according to claim 1, wherein the film source material is in the form of granules having an average grain size of 0.1 to 10 mm.

6. The process according to claim 5, wherein the plasma is generated over the film source material by radio frequency power.

7. The process according to claim 1, wherein the surface of the film source material is heated so as to have a temperature falling within the range of 650 to 1100° C.

* * * * *